United States Patent
Hallapuro et al.

(10) Patent No.: US 8,350,735 B2
(45) Date of Patent: Jan. 8, 2013

(54) METHOD FOR CODING AND AN APPARATUS

(75) Inventors: Antti Olli Hallapuro, Tampere (FI); Kemal Ugur, Tampere (FI)

(73) Assignee: Nokia Corporation, Espoo (FI)

( * ) Notice: Subject to any disclaimer, the term of this patent is extended or adjusted under 35 U.S.C. 154(b) by 38 days.

(21) Appl. No.: 12/783,067

(22) Filed: May 19, 2010

(65) Prior Publication Data

US 2010/0295712 A1 Nov. 25, 2010

Related U.S. Application Data

(60) Provisional application No. 61/179,484, filed on May 19, 2009.

(51) Int. Cl.
*H03M 7/40* (2006.01)
(52) U.S. Cl. ............................................ 341/67; 341/65
(58) Field of Classification Search ........... 341/65, 341/67, 106, 107; 375/240, 253; 348/390
See application file for complete search history.

(56) References Cited

U.S. PATENT DOCUMENTS

| | | | |
|---|---|---|---|
| 5,400,075 A | | 3/1995 | Savatier |
| 5,528,628 A * | | 6/1996 | Park et al. .................... 375/240 |
| 7,894,532 B2 * | | 2/2011 | Otsuka .................... 375/240.23 |
| 7,965,207 B2 * | | 6/2011 | Hendrickson .................... 341/67 |
| 8,072,358 B2 * | | 12/2011 | Hagiya et al. .................. 341/67 |
| 2008/0063055 A1 | | 3/2008 | Abe et al. |

FOREIGN PATENT DOCUMENTS

| | | |
|---|---|---|
| EP | 0 283 735 A2 | 9/1988 |
| EP | 1 453 208 A1 | 9/2004 |
| WO | WO 97/35383 A1 | 9/1997 |
| WO | WO 98/36574 A1 | 8/1998 |

OTHER PUBLICATIONS

D.A. Huffmann, "A Method for the Construction of Minimum-Redundancy Codes", Proceedings of the I.R.E., Sep. 1952, pp. 1098-1102.

J.S. Vitter, "Design and Analysis of Dynamic Huffman Codes," Journal of the Association for Computing Machinery, vol. 34, No. 4, Oct. 1987, pp. 825-845.

Sridhar Srinivasan, Chengjie Tu, Zhi Zhou, Dipankar Ray, Shankar Regunathan and Gary Sullivan, "An Introduction to the HD Photo Technical Design", 27 pages.

Hartung, F. et al., *Improved Encoding of DCT Coefficients for Low Bit-Rate Video Coding Using Multiple VLC Tables*, Int. Conf. on Image Processing (ICIP'1999) Kobe, Japan (Oct. 1999) 51-55.

(Continued)

*Primary Examiner* — Brian Young
(74) *Attorney, Agent, or Firm* — Alston & Bird LLP

(57) ABSTRACT

The disclosure relates to variable length encoding and decoding. A symbol is variable length encoded by selecting a variable length code word table from a set of variable length code word tables based on a value of a variable; selecting a code word from the selected variable length code word table on the basis of said symbol; and updating the value of said variable by comparing the correspondence between said symbol and said variable. If the comparison indicates that the value of the variable is smaller than the symbol, the value of said variable is incremented; else if the comparison indicates that the value of the variable is greater than the symbol, the value of said variable is decremented; else the value of the variable is not amended.

27 Claims, 4 Drawing Sheets

OTHER PUBLICATIONS

Jeon, B. et al., *Huffman Coding of DCT Coefficients Using Dynamic Codeword Assignment and Adaptive Codebook Selection*, Signal Processing: Image Communication, vol. 12, No. 3 (Jun. 1998) 253-262.

Knuth, D. E., *Dynamic Huffman Coding*, Journal of Algorithms 6 (1985) 163-180.

International Search Report and Written Opinion for Application No. PCT/FI21010/050398 dated Sep. 2, 2010.

* cited by examiner

METHOD FOR CODING AND AN APPARATUS

RELATED APPLICATION

This application claims priority to U.S. Provisional Patent Application Ser. No. 61/179,484, filed on May 19, 2009, which is hereby incorporated by reference in its entirety.

TECHNICAL FIELD

There is provided a method for selecting a table for variable length encoding, a method for selecting a table for variable length decoding, an apparatus, a encoder and a decoder.

BACKGROUND INFORMATION

When source symbols are coded using code words which may have different lengths, the source symbols are translated to unique code words. This kind of coding can be called as a variable length coding (VLC). The coding may be designed so that more probable symbols are represented with shorter code words and less probable symbols are represented with longer code words. Shorter code words can be represented with less bits compared to longer code words when the code words are transmitted. One aim of the variable length coding is to reduce the amount of information needed to represent the symbols compared to the situation that the symbols were encoded as such. In other words, when a set of symbols is translated to code words, the resulting coded representation should contain fewer bits than the source. The set of symbols may include many kinds of information. For example, a set of symbols can be a file consisting of bytes, an information stream such as a video stream or an audio stream, an image, etc.

The design of variable length code words can depend on the probability statistics of the source of which the source symbols represent. To obtain a set of code words for variable length coding probability statistics can be gathered from some representative source material and the code words are designed around those statistics. This may work quite well, but in many cases statistics are not stationary and may vary in time and having fixed set of code words may not produce good compression. To achieve better compression, the set of variable length code words could be constantly adapted locally to observed statistics of the source.

One way of performing adaptation is to keep track of symbol frequencies and use the frequencies to define the set of variable length code words on-the-fly as the symbols are coded. This kind of full adaptation is quite complex operation, especially if the range of source symbols is large. In practical implementations, some form of suboptimal adaptation is performed. For example, the encoder could use a number of predefined sets of variable length code words and select one set of them based on estimation of local statistics. In another implementation coder could gradually adapt the code words of the set so that only few of the individual code words of the set are changed at a time so that the complexity per coded code word is low.

As for the generation of set of variable length code words there are some ways to do it. An example way is to use Huffman method or an adaptive version of it. Another method is to use so called universal codes (exp-colomb codes, for example) to form the set of variable length code words. The creation of universal code words is regular and so the codes are rather easy to decode. However, optimal encoding may not be achieved in many cases and symbols need to be kept ordered according to the symbol frequency.

SUMMARY

The present invention introduces a method for variable length coding by providing two or more variable length code word tables from which one table is selected to code one symbol. The selection of the variable length code word table is realized by estimating e.g. the probability distribution of the symbol using a variable and selecting the variable length code word table based on this variable and updating the variable after the symbol is coded.

According to one example embodiment of the present invention there is provided a method for selecting variable length code words for symbols.

According to a first aspect of the present invention there is provided a method for variable length encoding a symbol comprising:

selecting a variable length code word table from a set of variable length code word tables based on a value of a variable;

selecting a code word from the selected variable length code word table on the basis of said symbol;

updating the value of said variable by comparing the correspondence between said symbol and said variable wherein if the comparison indicates that the value of the variable is smaller than the symbol, the value of said variable is incremented; else if the comparison indicates that the value of the variable is greater than the symbol, the value of said variable is decremented; else the value of the variable is not amended.

According to a second aspect of the present invention there is provided a method for variable length decoding a code word comprising:

selecting a variable length code word table from a set of variable length code word tables based on a value of a variable;

using said code word to find a symbol corresponding said code word from the selected variable length code word table; and updating the value of said variable by comparing the correspondence between said symbol and said variable wherein if the comparison indicates that the value of the variable is smaller than the symbol, the value of said variable is incremented; else if the comparison indicates that the value of the variable is greater than the symbol, the value of said variable is decremented; else the value of the variable is not amended.

According to a third aspect of the present invention there is provided an apparatus comprising:

a code word table selector configured for selecting a variable length code word table from a set of variable length code word tables based on a value of a variable;

a code word selector configured for selecting a code word from the selected variable length code word table on the basis of a symbol;

an update element configured for updating the value of said variable by comparing the correspondence between said symbol and said variable wherein if the comparison indicates that the value of the variable is smaller than the symbol, the update element is configured for incrementing the value of said variable; else if the comparison indicates that the value of the variable is greater than the symbol, the update element is configured for decrementing the value of said variable.

According to a fourth aspect of the present invention there is provided an apparatus comprising:

a code word table selector for selecting a variable length code word table from a set of variable length code word tables based on a value of a variable;

a symbol determinator configured for finding a symbol corresponding said code word from the selected variable length code word table;

an update element for updating the value of said variable by comparing the correspondence between said symbol and said variable wherein if the comparison indicates that the value of the variable is smaller than the symbol, the update element is configured for incrementing the value of said variable; else if the comparison indicates that the value of the variable is greater than the symbol, the update element is configured for decrementing the value of said variable.

According to a fifth aspect of the present invention there is provided a storage medium having stored thereon a computer executable program code for use by an encoder, said program codes comprise instructions for:

selecting a variable length code word table from a set of variable length code word tables based on a value of a variable;

selecting a code word from the selected variable length code word table on the basis of said symbol;

updating the value of said variable by comparing the correspondence between said symbol and said variable wherein if the comparison indicates that the value of the variable is smaller than the symbol, the value of said variable is incremented; else if the comparison indicates that the value of the variable is greater than the symbol, the value of said variable is decremented; else the value of the variable is not amended.

According to a sixth aspect of the present invention there is provided a storage medium having stored thereon a computer executable program code for use by an encoder, said program codes comprise instructions for:

selecting a variable length code word table from a set of variable length code word tables based on a value of a variable;

using said code word to find a symbol corresponding said code word from the selected variable length code word table; and updating the value of said variable by comparing the correspondence between said symbol and said variable wherein if the comparison indicates that the value of the variable is smaller than the symbol, the value of said variable is incremented; else if the comparison indicates that the value of the variable is greater than the symbol, the value of said variable is decremented; else the value of the variable is not amended.

DETAILED DESCRIPTION

Figure 1:
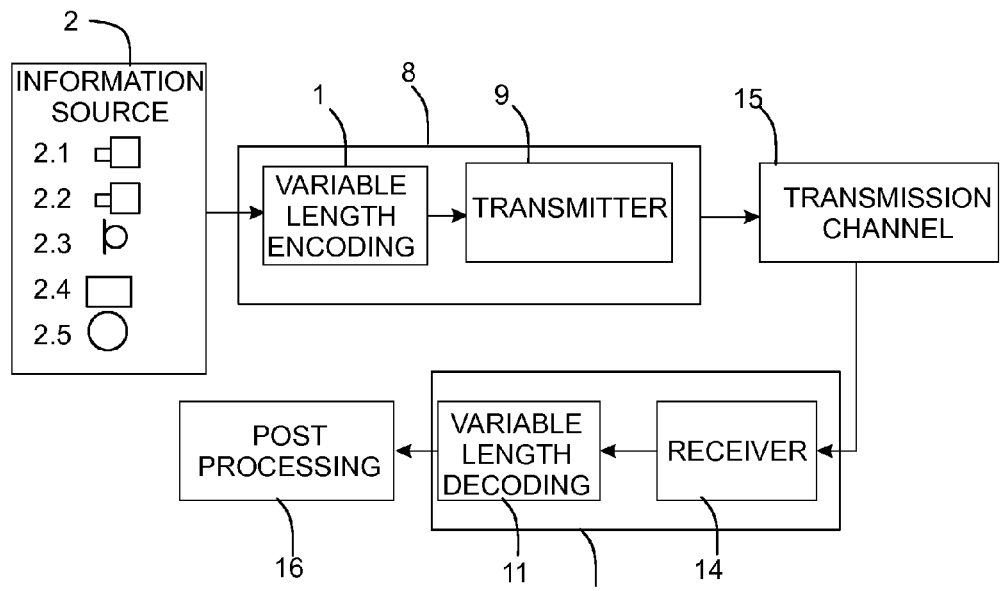
FIG. 1 depicts as a simplified block diagram an example embodiment of a system in which information is transmitted from an encoder to a decoder.

In the following the system of FIG. 1 will be described in more detail. The information to be encoded and transmitted is received by an encoder 1 from a source 2. The information can be e.g. video information, audio information, still images, text, etc. The information can also be a combination of two or more different kind of information. Then, there may be provided different encoders and decoders for each type of information or the same encoder and/or decoder may process different kinds of information. The source 2 can be, for example, a video camera 2.1, a still camera 2.2, a microphone 2.3, a device 2.4 capable of playing back e.g. digital versatile disks (DVD), a storage medium 2.5, etc. The above examples of the information and the source 2 are only for illustrating the present invention, not for limiting the scope of the present invention. The information from the source 2 is encoded by an encoder 1 of the first device 8. The encoded information can be stored to a memory 4 and/or transmitted by a transmitter 9 to a transmission channel 15. The transmitted information can be received by a receiver 14 of a second device 10. The second device 10 comprises a decoder 11 which decodes the received information. The decoded information can be post-processed, for example, by storing the decoded information to a memory 12 of the second device, displayed by a display, if the information contains visual information, transformed to audio information, if the information contains audio information etc.

Figure 2:
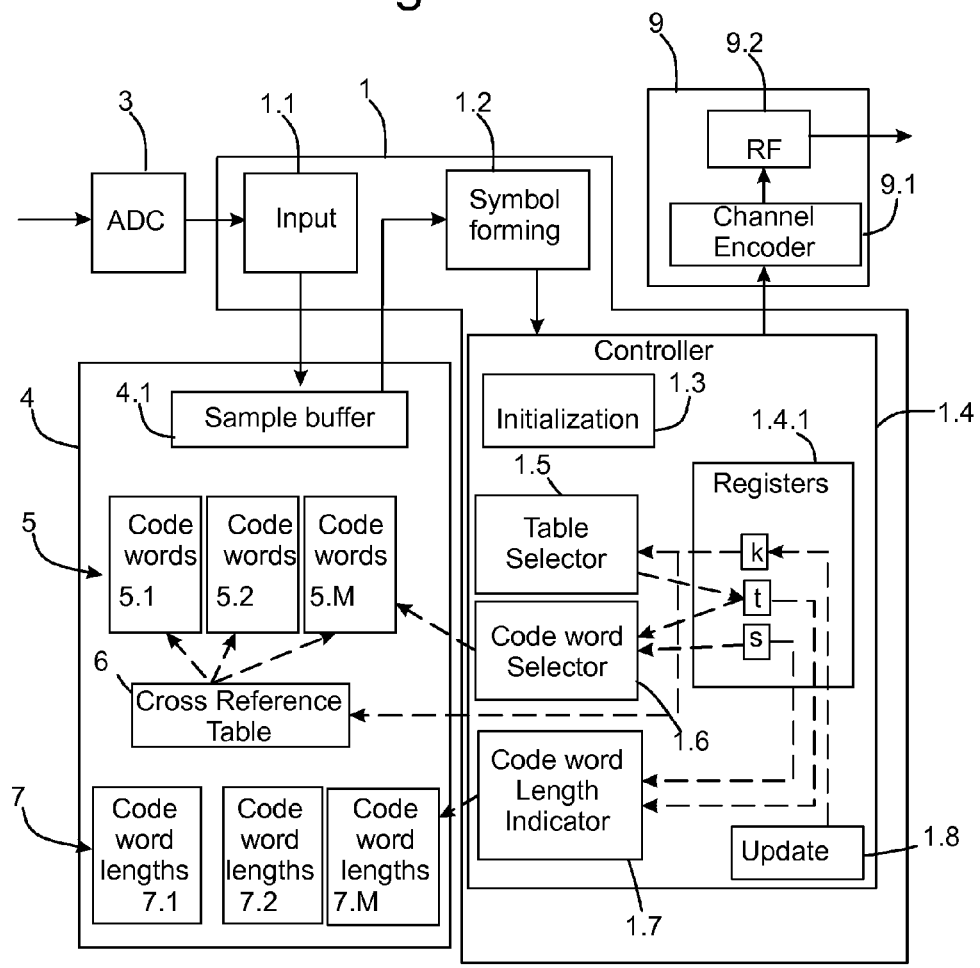
FIG. 2 depicts as a simplified block diagram an encoder according to an example embodiment of the present invention.

An example embodiment of the encoder 1 is depicted in FIG. 2. The encoder 1 has an input 1.1 to receive the information to be transmitted. If the information is in analogue form it is converted to a digital form by e.g. the analog-to-digital converter 3. The analog-to-digital converter 3 forms samples on the basis of the analogue information. The samples represent the analogue signal at some time intervals. However, the information may already be in the form in which the encoder 1 can process it. Hence, the analog-to-digital converter 3 may not be needed.

The information at the input 1.1 of the encoder can be arranged into frames of samples. Each frame represents some time interval of the analogue signal. In an example embodiment one frame can comprise samples which represent a 20 ms period of the input signal. In another embodiment the frame consists of samples representing a 10 ms period of the input signal. Also other values are possible here. The samples can be stored to a sample buffer 4.1 which can be inside the encoder 1 or outside it.

In the above it was assumed that the information from the source 2 is a sequence of video, audio etc. kind of streaming information but the information from the source 2 can also represent a non-alternating piece of information, for example a still image or a data file. In that kind of situations the information can be divided into smaller portions for encoding or the information can be encoded symbol by symbol.

Irrespective of whether the information is from a streaming information source or from a fixed information source, the samples are encoded by the encoder 1 to form code words. In the following the encoding process is described in more detail with reference to the flow diagram of FIG. 4 and to the encoder 1 of FIG. 2. It is assumed here that some statistical parameters can be estimated from the information to be encoded. For example, the probability distribution of symbols representing the information may be known or may be estimated by using some criteria. In the present invention two or more different sets of variable length code words are provided from which a variable length code words is selected for a symbol to be encoded. The sets of code words can be thought to form different variable length code word tables 5.1-5.M (VLC tables) in which rows represent the symbol to code word mappings. The variable length code word tables are also called as code word tables in the specification, There are many possibilities to implement the code word tables in practical applications. This will be discussed in more detail later in the specification.

The encoder 1 according to an example embodiment of the present invention performs the encoding as follows. In the beginning of the encoding some variables are initialized to their initial values. This is performed, for example, by the controller 1.4 of the encoder which sets some memory locations to a selected state. These memory locations can be located in the memory 4 or they can be internal to the controller 1.4, for example. In the example embodiment of FIG. 2 the variables are stored into the internal registers 1.4.1 of the controller 1.4. The initialization phase is depicted with block 401 in the flow diagram of FIG. 4 and with an initialization block 1.3 in FIG. 2.

After the initialization phase the encoding of the symbols can be started. The controller 1.4 instructs the input 1.1 to read one or more samples from the sample buffer 4.1 to a symbol forming block 1.2 (block 402 in FIG. 4). One symbol may represent one sample or more than one sample of the information. For example, three samples can form one symbol wherein the symbol forming block 1.2 uses three consecutive samples from the sample buffer 4.1 to construct one symbol.

In the following it is assumed that one symbol represents one sample and that the symbols has only a few possible values. However, in practical applications the symbols can have a larger range of possible values than what is disclosed below.

The symbol forming block 1.2 is not needed if the information which is input to the encoder 1 is already in a symbol form.

The encoding utilizes a variable k which is adapted during the progress of the encoding. In the initializing phase the variable k has been set to an initial value as follows.

$k=K$

The initialization constant K may have a value that reflects the expected probability distribution.

Figure 4:
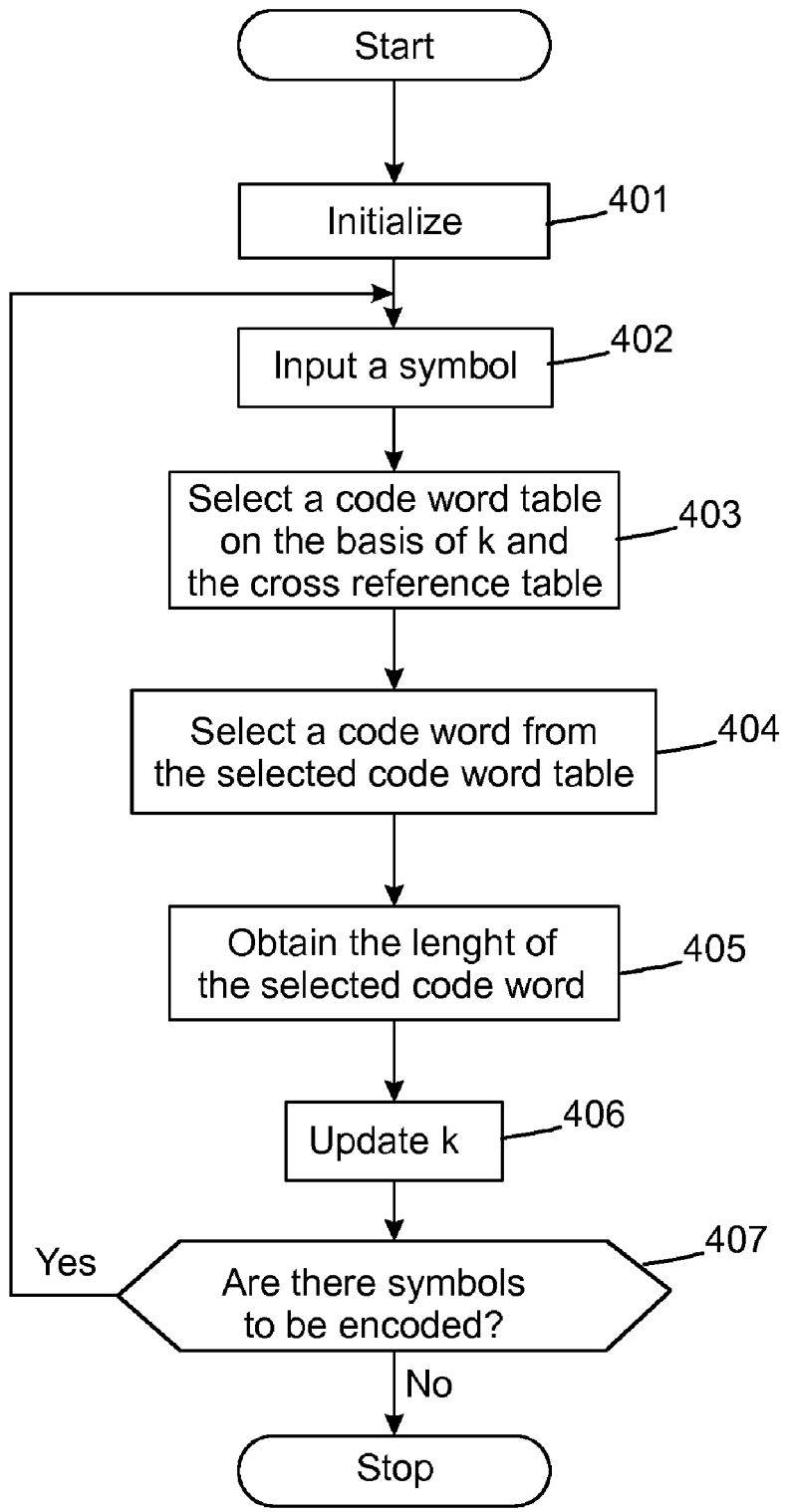
FIG. 4 depicts as a flow diagram an encoding method according to an example embodiment of the present invention.

To encode the symbol a code word table selector 1.5 performs a selection of the code word table from the set of code word tables (block 403 in FIG. 4). The selection of the variable length code word table is realized by estimating e.g. the probability distribution of the symbol using a variable and selecting the code word table based on this variable and updating the variable k. Although the flow diagram of FIG. 4 depicts that the variable k is updated after the symbol has been encoded, the order can also be different from that. For example, the variable can be updated during or before encoding the symbol.

Let s be the symbol to be coded. Symbols can be anything such as alphabet, but for illustrating the invention they are denoted here as numbers 0, 1, . . . , N–1, where N is the number of unique symbols. The symbol may be selected from a set of symbols in which the symbols have a mutual order and one symbol represents a greatest symbol value and another symbol represents a lowest symbol value in the set of symbols. The code word table selector 1.5 uses the variable k and a cross-reference table 6 to select one code word table among the set of code word tables 5.1-5.M so that the symbol s can be mapped to a code word. The cross-reference table 6 maps the value of the variable k into a code word table number t, which indicates the code word table to be selected for the encoding. The cross-reference table 6 has as many rows than the number of different possible values of the variable k. The rows indicate the correspondence between the value of the variable k and the number of code word table 5.1-5.M. For example, if k has the value 0, the code word table indicated by the first row of the cross-reference table 6 is selected, if k has the value 1, the code word table indicated by the second row of the cross-reference table 6 is selected, etc. A non-limiting example of the cross-reference table 6 is depicted in Table 1 below:

TABLE 1

| table_num | |
| --- | --- |
| k | t |
| 0 | 0 |
| 1 | 1 |
| 2 | 1 |
| 3 | 1 |
| 4 | 1 |
| 5 | 2 |
| 6 | 2 |
| 7 | 2 |

In this example k can have values from 0 to 7 and the number of different code word tables is 3 i.e. M is 3 in this non-limiting example. However, in another example embodiment the variable can have an upper limit which is smaller than the greatest symbol value in the set of symbols. In a still another embodiment the variable can have a lower limit which is greater than the smallest symbol value in the set of symbols. There can also be embodiments in which both the lower limit and the upper limit have been defined for the variable k.

The column t of the cross-reference table 6 indicates the code word table to be selected. The code word table selector 1.5 uses the value at the k-th row of the table number column t of the cross-reference table 6 as the index to the code word table. For example, if the value at the k-th row is 0, the first code word table 5.1 is selected, if the value is 1, the second code word table 5.2 is selected, etc. In the example of Table 1 the first code word table 5.1 is selected when the variable k is 0, the second code word table 5.2 is selected when the variable k is 1, 2, 3 or 4, and the third code word table 5.M is selected when the variable k is 5, 6 or 7.

The code word table selector 1.5 informs the code word selector 1.6 of the selected code word table. This can be performed e.g. in such a way that the code word table selector 1.5 stores the value of the parameter t into a memory 4 or into the register(s) of the controller 1.4. The code word selector 1.6 uses the value of the parameter t to use the selected code word table in the selection of a code word to represent the symbol s (block 404 in FIG. 4). The code word selector 1.6 uses the symbol s and the selected code word table to determine the code word. In other words, the value of the symbol s indicates the code word in the selected code word table. Table 2 below depicts an example of a set of code word tables in which three different code word tables are provided (t=0, t=1, t=2).

TABLE 2

| | code_word (in binary format) | | |
|---|---|---|---|
| | | cw | |
| s | t = 0 | t = 1 | t = 2 |
| 0 | 1 | 10 | 000 |
| 1 | 010 | 11 | 001 |
| 2 | 011 | 010 | 010 |
| 3 | 00100 | 011 | 011 |
| 4 | 00101 | 0010 | 100 |
| 5 | 00110 | 0011 | 101 |
| 6 | 00111 | 00010 | 110 |
| 7 | 0001000 | 00011 | 111 |

There can also be a code word length table 7 for each code word table 6 which indicates the length of each code word. The code word length indicator 1.7 can use the symbol s and the parameter t to obtain the value indicative of the length of the selected code word (block 405 in FIG. 4). Table 3 below depicts an example of a set of code word length tables in which three different code word length tables 7.1-7.M are provided (t=0, t=1, t=2).

TABLE 3

| | cw_length | | |
|---|---|---|---|
| | | len | |
| s | t = 0 | t = 1 | t = 2 |
| 0 | 1 | 2 | 3 |
| 1 | 3 | 2 | 3 |
| 2 | 3 | 3 | 3 |
| 3 | 5 | 3 | 3 |
| 4 | 5 | 4 | 3 |
| 5 | 5 | 4 | 3 |
| 6 | 5 | 5 | 3 |
| 7 | 7 | 5 | 3 |

The above described code word table selection, code word selection and the determination of the code word length can be defined in the following way.

t=table_num[k]
cw=code_word[t,s]
len=cw_length[t,s]

where table_num is an array (the cross-reference table 6) that selects which variable length code word table to use, the code_word is an array that maps symbols s to code words (the code word tables 5.1-5.M) and cw_length is an array of corresponding code word length values (the code word length tables 7.1-7.M). The resulting code word cw with length len is sent to its destination, for example for storage or for transmission.

After a symbol has been encoded, the variable k is updated e.g. by the controller 1.4 according to the following equation (block 406 in FIG. 4).

$$k = k + \begin{cases} 0, & k = s \\ L, & k < s \\ -L, & k > s \end{cases}$$

where L is a positive integer. This means that if the variable k is the same than the symbol s, the variable k is not altered, otherwise the variable k is increased by the positive integer L if the variable k is smaller than the symbol s, or the variable k is decreased by the positive integer L if the variable k is larger than the symbol s. The parameter L defines an offset by which the variable is amended when it is determined that the variable should be amended. In the above it was assumed that the amount of the amendment is constant but in another example embodiment of the present invention the offset may vary depending e.g. on the difference between the symbol s and the variable k. For example, the offset may be larger when the difference is large and smaller when the difference is smaller.

Block 407 in FIG. 4 determines whether there are more symbols to be encoded. If so, the operation continues from the block 402 by inputting the next symbol until code words have been selected to all the symbols which are to be encoded.

To further illustrate the example embodiment presented above a numerical example is provided in the following. Let us select the value of the initialization constant equal to 3, the value of the integer L equal to 2, and an example of the symbol sequence 3, 1, 5, 4, 2. Hence, in the beginning of the encoding process the variable k gets the value K=3. The cross-reference table 6 indicates (k=3) that the code word table to be selected is the second (t=1) code word table. The first symbol to be encoded is 3. In the second code word table 5.2 symbol 3 is mapped to the code word 011. Because k=s, the value of k is not amended at this stage. Then, the next symbol (1) is input for encoding. The same code word table is in use in which the symbol 1 is mapped to the code word 11. The value of the symbol is smaller than the variable k wherein the variable k is decreased by the value of the integer L i.e. the new value for k is 1 (=3-2). The next symbol to be encoded is 5 by using the second code word table 5.2. The symbol 5 is mapped to the code word 0011. The value of the symbol is bigger than the current value of the variable k wherein the value of the variable k will be increased by L i.e. k=3. The next symbol is 4. The second code word table is selected so the symbol 4 is mapped to the code word 0010. The value of the variable k is again increased by 2 because k<s resulting that the variable k gets the value 5. This means that the next symbol will be encoded by using the third code word table. The symbol is 2 which is mapped to the code word 010. After encoding the last symbol (2) of this example sequence the value of the variable k is again decreased by L i.e. k=3. The encoding result i.e. the bit stream of variable length code words is 0111100110010010. This bit stream can be stored into a storage medium or sent to a transmitter 9 for transmitting to another device, for example to the second device 10 of FIG. 1. The transmitter 9 can comprise e.g. a channel encoder 9.1 to perform channel encoding to the bit stream which is transformed to e.g. radio frequency signals by a transmission block 9.2.

The design of the cross-reference table 6, the code word tables 5.1-5.M and the code word length tables 7.1-7.M can be application specific, e.g. there is not necessarily a single set of tables that works for every use case. However, Tables 1, 2 and 3 above illustrate one possible table design that might be used.

In a more general case, mapping of symbols to code words is not fixed. For example, if a symbol s has a value of 0, the code word for the symbol s is not necessarily the first entry in the table. In this case symbol value cannot be directly used for getting code word value and an extra table is needed to represent this mapping. Coding of a symbol s could proceeds as follows.

n=cw_num[s]
t=table_num[k]
cw=code_word[t,n]
len=cw_length[t,n]

where cw_num is a table that maps symbol values to code word numbers. Code word number is then used to get the actual code word.

After a symbol has been coded, the variable k is updated:

$$k = k + \begin{cases} 0, & k = n \\ L, & k < n \\ -L, & k > n \end{cases}$$

The encoder 1.4 can comprise an update element 1.8 for updating the value of the variable k and possibly some other variables.

In the previous examples, all the variables were integer numbers. In an alternative implementation k and L are floating point or fixed point values and k is rounded to the nearest integer value or truncated to the integer value before using it for getting the table number. The symbols which are used for representing the information of the source need not be numbers but can also comprise other kind of elements such as alphabetic characters. The available symbols in the set of symbols have a mutual order. For example, numbers 0 to N−1 can be ordered in ascending or descending order. It was also assumed above that there is a one-to-one correspondence between the values of the variable k and the symbols. In other words, the variable k could have such a value which corresponds with a possible symbol. In the example above k can have a value $0, 1, \ldots, N-1$ ($k \in 0, 1, \ldots, N-1$). Hence, the value of the variable k can be compared with the symbol s to determine whether the value of the variable k is less than, greater than or equal to the symbol s. Therefore, even if all the symbols are numerical elements, the mutual order can be used to determine whether the variable k is less than, greater than or equal to the symbol s. For example, if the set of symbols comprises letters A to F the variable k could also be set to a value which corresponds with the letter A, B, C, D, E or F. It may also be possible to define a cross-reference table (not shown) for the correspondence between possible symbol values and the values of the variable k. For example, the cross-reference table could indicate that symbols A to F correspond with values 10 to 15 of the variable k, respectively.

Also, in the previous examples, the code word was loaded from a pre-defined table that resides in the memory 4, for example. However, in some cases it is possible to generate the code word on-the-fly so that code words do not need to be stored in the memory. When the encoder needs to get a code word it uses the table number and the code word number to generate the code word using a predefined algorithm. it is also possible that the cross-reference table 6 is replaced with an algorithm which generates the index of the code word table on the basis of the variable k.

The storage of the code word tables 5.1-5.M, the cross-reference table 6, and the code word length tables 7.1-7.M can be implemented in many ways. They can be stored e.g. to the memory 4 of the first device 8. Each row can be stored in consecutive memory locations so that each value has a certain length of bits or so that after each value there is a field separator to separate different columns from each other. It is also possible to store the values of the tables column-by-column.

Figure 3:
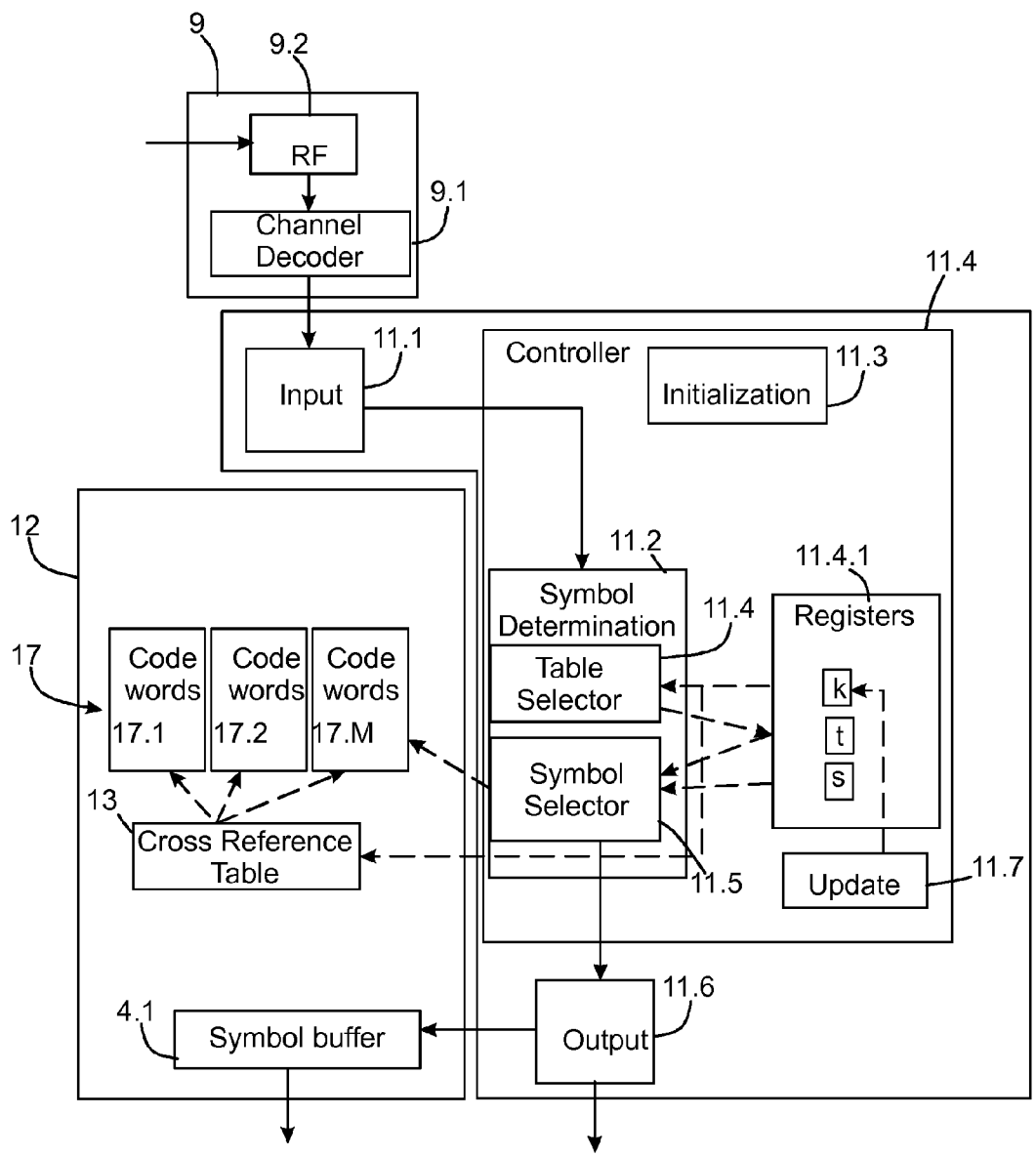
FIG. 3 depicts as a simplified block diagram a decoder according to an example embodiment of the present invention.

In the above some principles of the present invention were discussed from the encoder point of view, but decoder implementation is quite similar except that the code word processing is reversed i.e. the received code word is used to determine the corresponding symbol. This is now explained in more detail with reference to the decoder of FIG. 3 and the flow diagram of FIG. 5. The second device 10 (FIG. 1) receives the transmitted information and performs in the receiver 14 e.g. conversion 14.1 of a radio frequency signal to a lower frequency signal (for example to a base band signal), channel decodes 14.2 the lower frequency signal and/or some other operations to obtain code words from the received signal. The received code words can be stored in the memory 12 of the second device for further processing. In this example the same bit stream is used which was presented above in connection with the encoding process i.e. 0111100110010010.

An initialization block 11.3 of a decoder 11 initializes (block 501 in FIG. 5) the variable k (k=K). The decoder 11 has access to tables corresponding the tables of the encoder. For example, the decoder 11 has a similar set of code word tables 17.1-17.M than the code word tables 5.1-5.M of the encoder 1. The decoder 11 also has a cross-reference table 13 corresponding the cross-reference table 6 of the encoder. The tables can be formed e.g. in the memory 12 of the decoder or the decoder 11 can comprise some algorithms to use instead of the tables.

Figure 5:
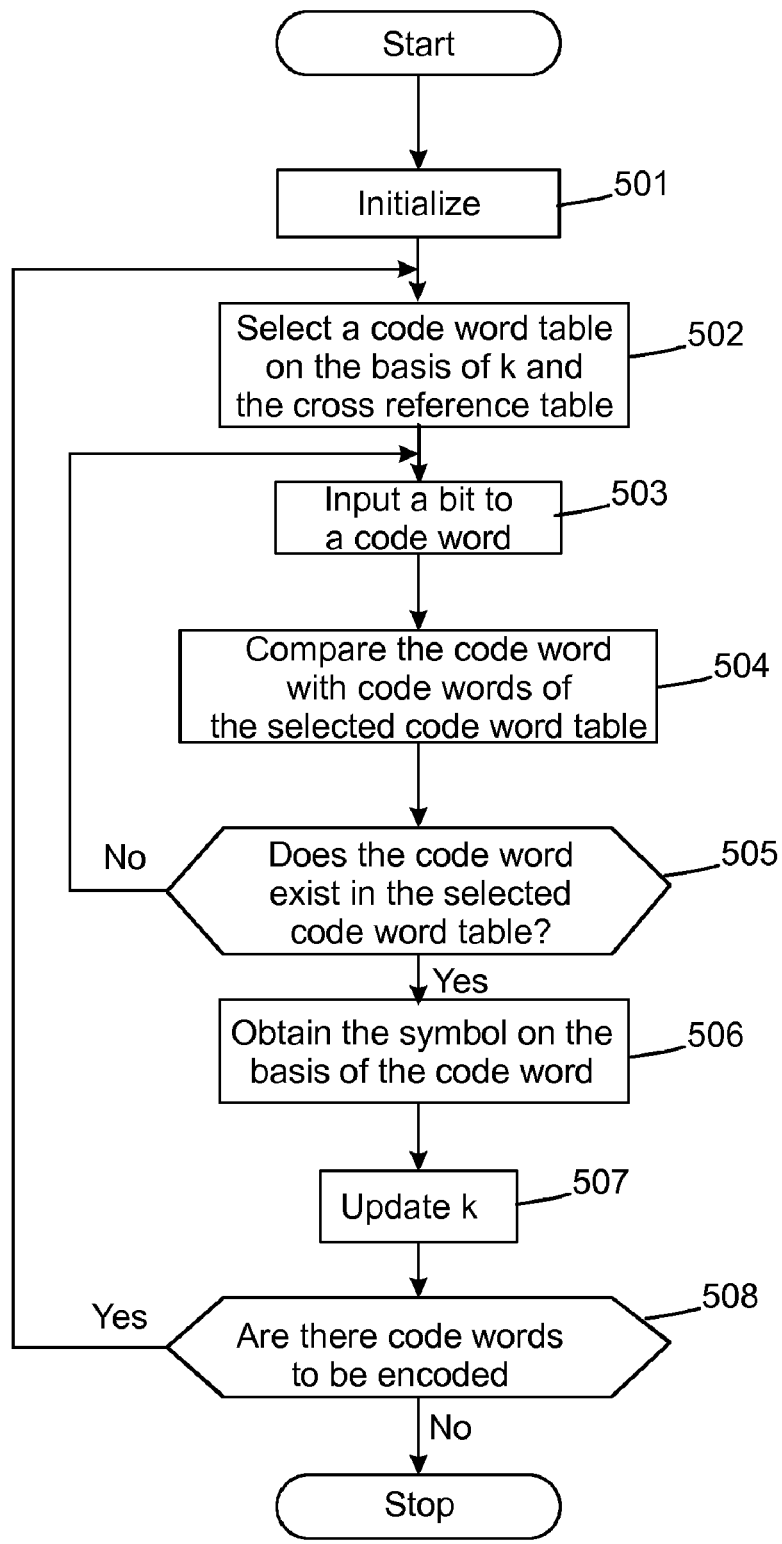
FIG. 5 depicts as a flow diagram a decoding method according to an example embodiment of the present invention.

The symbol determination block 11.2 uses the current value of the variable k and the cross-reference table 13 to select the code word table (block 502 in FIG. 5). This operation is depicted as a table selector 11.4 in FIG. 3. In this example, the k is initially set to 3 (=K) wherein the cross-reference table 13 indicates that the second code word table 17.2 is used in mapping the code word to the symbol.

The received bits are input e.g. one by one or in larger parts to the input 11.1 of the decoder 11 from which the bits are delivered to the symbol determination block 11.2 (block 503 in FIG. 5). The first bit of the received bit stream (i.e. the left most bit in this example embodiment) is 0. The symbol determination block 11.2 examines the code words of the second code word table 17.2 to determine whether such a code word exists in the second code word table (blocks 504 and 505 in FIG. 5). If the examination indicates that the code word exists, the code word thus obtained can be used to determine the symbol. However, in this example embodiment the bit pattern 0 is not a code word in the second code word table 17.2. Therefore, the next bit is also input and combined with the first bit. The combination is 01 and the symbol determination block 11.2 determines whether this is a valid code word. In this example also this bit pattern is not a code word in the second code word table 17.2 so the next bit is input to the symbol determination block 11.2. Now, the combination of these bits is 011. This code word exists in the second code word table 17.2. Therefore, the corresponding symbol can be determined on the basis of the second code word table (block 506 in FIG. 5). The first column indicates that the corresponding symbol is 3 which the symbol determination block 11.2 outputs at the output 11.5 of the decoder. The symbol can also be stored to the symbol buffer which can be implemented e.g. in the memory 12 of the second device 10. The symbol can be stored to the memory 12, for example. The symbol determination block 11.2 can comprise a symbol selector 11.5 for performing the examination of the code words and corresponding symbols in the code word table 17.

After finding the code word from the input bit stream the value of the variable k can be updated (block 507 in FIG. 5). The rules for updating the variable k are the same than used in the encoder i.e.

$$k = k + \begin{cases} 0 & , k = s \\ L & , k < s \\ -L & , k > s \end{cases}$$

The symbol determination block 11.2 can comprise an update element 11.5 for updating the value of the variable k and possibly some other variables.

The determined symbol was 3 which equals to the present value of the variable k. Hence, the variable k is not amended and the same code word table will be used in the decoding of the next code word.

Although the flow diagram of FIG. 5 depicts that the variable k is updated after the symbol has been decoded, the order can also be different from that. For example, the variable can be updated during or before decoding the symbol.

The procedure continues e.g. by examining whether there are more bits to be examined (block 508 in FIG. 5). If so, the operation continues by selecting a code word table on the basis of the variable k and the cross reference table 13 (in block 502). In this example the next bit is 1. This is not a valid code word in the second code word table so the next bit is input. The combination of the bits to be examined by the symbol determination block 11.2 is now 11 which is a valid code word in the second code word table. The corresponding symbol is 1.

It should be noted here that there are also other possibilities to decode the symbol from the code word. It need not happen bit by bit but any kind of method of finding the matching codeword can be utilized in this context. For example, a part of the bit stream is input to the input 11.1 of the decoder 11 from which the bits are delivered to the symbol determination block 11.2. The symbol determination block 11.2 examines from the selected variable length code word table if said part of the bit stream comprises a code word in said selected variable length code word table. if the examination indicates that said part of the bit stream comprises a code word in said selected variable length code word table, the symbol determination block 11.2 determines which symbol in said selected variable length code word table corresponds with the code word, and outputs the symbol. If the examination indicates that said part of the bit stream does not comprise any code word in said selected variable length code word table, a next part of the bit stream is input to the input 11.1 of the decoder 11 and delivered to the symbol determination block 11.2 for further examination. The above steps are repeated until a valid code word has been found from the selected variable length code word table.

There are also other possibilities to find matching code words in the decoding process such as using look-up tables or using binary tree.

By repeating the process the bit stream is correctly decoded resulting the same symbol stream which was transmitted i.e. in this case the resulting symbol stream is 3, 1, 5, 4, 2.

In the above examples the functional elements of the encoder 1 and the decoder 11 were depicted as separate blocks. However, in practical implementations the functional elements or some of them can be implemented in hardware or as a program code of the controller 1.4 of the encoder 1 and/or the controller 11.4 of the decoder 11. The controllers 1.4, 11.4 can be digital signal processors or other processors comprising program code interpreter of other means for executing program code. The program code can be stored into a storage medium such as the memory 4, 12 or into a disk e.g. a CDROM, or to another kind of a carrier.

Regardless of how the code word values are generated, the invention can be implemented as a method and in an apparatus comprising at least means for determination of the variable length code word table number and for updating of the variable k. The determined variable length code word table number and the symbol to be encoded can then be used to represent the symbol by a code word. Respectively, in the decoding phase the symbol can be found out by using the code word and the determined variable length code word table number.

The invention can be used in applications that use data compression, for example to compress video signals. In video coding, it has been observed that the method is beneficial for coding at least a macroblock mode, a coded block pattern (cbp) and position of the last non-zero coefficient in discrete cosine transform (DCT) transformed block.

In an example embodiment the code word length increases monotonically from the beginning to the end of the table (i.e. length of a code word is greater than or equal to length of any code word that is before it in the table), but also other kind of code word table design principles can be used within the scope of the present invention.

In the following another example of the cross-reference table 6 is disclosed:

TABLE 4

| table_num | |
|---|---|
| k | t |
| 0 | 0 |
| 1 | 0 |
| 2 | 1 |
| 3 | 2 |
| 4 | 3 |
| 5 | 3 |
| 6 | 3 |
| 7 | 3 |
| 8 | 3 |
| 9 | 3 |

In this example there areour code word tables of which an example is disclosed in the following table:

TABLE 5

| | code_word (in binary format) | | | |
|---|---|---|---|---|
| | | cw | | |
| s | t = 0 | t = 1 | t = 2 | t = 3 |
| 0 | 1 | 10 | 100 | 0001 |
| 1 | 010 | 11 | 101 | 0010 |
| 2 | 011 | 010 | 110 | 0011 |
| 3 | 00100 | 011 | 111 | 0100 |
| 4 | 00101 | 0010 | 001 | 0101 |
| 5 | 00110 | 0011 | 010 | 0110 |
| 6 | 00111 | 00010 | 011 | 0111 |
| 7 | 0001000 | 00011 | 00001 | 1000 |
| 8 | 0000100 | 000010 | 00010 | 1001 |
| 9 | 0000101 | 000011 | 00011 | 1010 |

The length table corresponding the cord word table of Table 5 could contain the following values:

TABLE 6

| | cw_length | | | |
|---|---|---|---|---|
| | len | | | |
| s | t = 0 | t = 1 | t = 2 | t = 3 |
| 0 | 1 | 2 | 3 | 4 |
| 1 | 3 | 2 | 3 | 4 |
| 2 | 3 | 3 | 3 | 4 |
| 3 | 5 | 3 | 3 | 4 |
| 4 | 5 | 4 | 3 | 4 |
| 5 | 5 | 4 | 3 | 4 |
| 6 | 5 | 5 | 3 | 4 |
| 7 | 7 | 5 | 5 | 4 |
| 8 | 7 | 6 | 5 | 4 |
| 9 | 7 | 6 | 5 | 4 |

The first device 8 comprising the encoder 1 can be, for example, a wireless communication device, a computer, a server, a CDROM player, a DVD player, etc. The second device 10 comprising the decoder 11 can be, for example, a wireless communication device, a computer, a server, a CDROM player, a DVD player, etc. The transmission channel 15 can comprise a communication network such as a wireless communication network, a local area network, a wired or a wireless connection between the first device 9 and the second device 10, etc.

The invention is not solely limited to the above mentioned examples but it can be varied within the scope of the claims.

What we claim is:

1. A method comprising:
    selecting a variable length code word table from a set of variable length code word tables based on a value of a variable;
    selecting a code word from the selected variable length code word table on the basis of a symbol;
    updating the value of said variable by comparing the correspondence between said symbol and said variable wherein
    if the comparison indicates that the value of the variable is smaller than the symbol, the value of said variable is incremented; else
    if the comparison indicates that the value of the variable is greater than the symbol, the value of said variable is decremented; else
    the value of the variable is not amended.

2. The method of claim 1 further comprising: repeating the above steps to encode another symbol.

3. The method of claim 1 further comprising:
    defining an offset for the amendment of said variable wherein if the comparison indicates that the variable shall be amended, the magnitude of the amendment of the variable is defined by said offset.

4. The method of claim 3 further comprising:
    determining the difference between the symbol and said variable, wherein said offset depends on the determined difference.

5. The method of claim 1 further comprising:
    estimating a statistical parameter from the information to be encoded;
    defining the code words in said variable length code word tables on the basis of the estimated statistical parameter.

6. The method of claim 5, wherein said estimating comprising determining the probability distribution of symbols representing the information.

7. The method of claim 1 further comprising: selecting said symbol from a set of symbols.

8. The method of claim 1 further comprising:
    defining a set of symbols selected from a set of symbols in which the symbols have a mutual order and one symbol represents a greatest symbol value and another symbol represents a lowest symbol value in the set of symbols.

9. The method of claim 8 further comprising at least one of the following:
    selecting an upper limit for the variable k which is smaller than a greatest symbol value in the set of symbols; or
        selecting a lower limit which is greater than the smallest symbol value in the set of symbols; or
        selecting both an upper limit for the variable k which is smaller than a greatest symbol value in the set of symbols and a lower limit which is greater than the smallest symbol value in the set of symbols.

10. A method comprising:
    selecting a variable length code word table from a set of variable length code word tables based on a value of a variable;
    using said code word to find a symbol corresponding said code word from the selected variable length code word table; and
    updating the value of said variable by comparing the correspondence between a symbol and said variable wherein
        if the comparison indicates that the value of the variable is smaller than the symbol, the value of said variable is incremented; else
        if the comparison indicates that the value of the variable is greater than the symbol, the value of said variable is decremented; else
        the value of the variable is not amended.

11. The method of claim 10 further comprising: repeating the above steps to decode another code word.

12. The method of claim 10 further comprising:
    defining an offset for the amendment of said variable wherein if the comparison indicates that the variable shall be amended the magnitude of the amendment of the variable is defined by said offset.

13. The method of claim 12 further comprising:
    determining the difference between the symbol and said variable, wherein said offset depends on the determined difference.

14. The method of claim 10 further comprising:
    inputting a bit from a bit stream;
    examining from the selected variable length code word table if said bit corresponds with a code word in said selected variable length code word table;
    if the examination indicates that said bit corresponds with a code word in said selected variable length code word table, determining which symbol in said selected variable length code word table corresponds with the code word, and outputting the symbol; else
    if the examination indicates that said bit does not correspond with any code word in said selected variable length code word table, inputting a next bit from the bit stream, and using the combination of the input bits in said examining phase; and
    repeating the above steps until a valid code word has been found from the selected variable length code word table.

15. The method of claim 10 further comprising:
    inputting at least a part of a bit stream;
    examining from the selected variable length code word table if said part of the bit stream comprises a code word in said selected variable length code word table;

if the examination indicates that said part of the bit stream comprises a code word in said selected variable length code word table, determining which symbol in said selected variable length code word table corresponds with the code word, and outputting the symbol; else if the examination indicates that said part of the bit stream does not comprise any code word in said selected variable length code word table, inputting a next part of the bit stream; and repeating the above steps until a valid code word has been found from the selected variable length code word table.

16. An apparatus comprising:
at least one processor; and
at least one memory including computer program instructions executed by the at least one processor, the computer program instructions comprising:
a code word table selector configured for selecting a variable length code word table from a set of variable length code word tables based on a value of a variable;
a code word selector configured for selecting a code word from the selected variable length code word table on the basis of a symbol;
an update element configured for updating the value of said variable by comparing the correspondence between said symbol and said variable wherein
if the comparison indicates that the value of the variable is smaller than the symbol, the update element is configured for incrementing the value of said variable; else
if the comparison indicates that the value of the variable is greater than the symbol, the update element is configured for decrementing the value of said variable.

17. The apparatus of claim 16 comprising an offset for the amendment of said variable wherein the update element is configured for using said offset in the amendment of the variable.

18. The apparatus of claim 17 wherein the update element is configured for determining the difference between the symbol and said variable, and further configured for determining the magnitude of the amendment on the basis of the determined difference.

19. The apparatus of claim 16 comprising a selector for selecting a symbol from a set of symbols to represent information from a source.

20. The apparatus of claim 19 wherein the symbols in the set of symbols have a mutual order and one symbol represents a greatest symbol value and another symbol represents a lowest symbol value.

21. The apparatus of claim 20 comprising at least one of the following:
an upper limit for the variable k which is smaller than a greatest symbol value in the set of symbols; or
a lower limit which is greater than the smallest symbol value in the set of symbols; or
both an upper limit for the variable k which is smaller than a greatest symbol value in the set of symbols and a lower limit which is greater than the smallest symbol value in the set of symbols.

22. An apparatus comprising:
at least one processor;
at least one memory including computer program instructions executed by the at least one processor, the computer program instructions comprising:
a code word table selector for selecting a variable length code word table from a set of variable length code word tables based on a value of a variable;
a symbol determinator configured for finding a symbol corresponding said code word from the selected variable length code word table;
an update element for updating the value of said variable by comparing the correspondence between said symbol and said variable wherein
if the comparison indicates that the value of the variable is smaller than the symbol, the update element is configured for incrementing the value of said variable; else
if the comparison indicates that the value of the variable is greater than the symbol, the update element is configured for decrementing the value of said variable.

23. The apparatus of claim 22 comprising an offset for the amendment of said variable wherein the update element is configured for using said offset in the amendment of the variable.

24. The apparatus of claim 23 wherein the update element is configured for determining the difference between the symbol and said variable, and further configured for determining the magnitude of the amendment on the basis of the determined difference.

25. The apparatus of claim 22 comprising:
an input configured for inputting a bit from a bit stream;
said symbol determinator configured for
examining from the selected variable length code word table if said bit corresponds with a code word in said selected variable length code word table;
determining which symbol in said selected variable length code word table corresponds with the code word, if the examination indicates that said bit corresponds with a code word in said selected variable length code word table and outputting the symbol;
examining a next bit from the bit stream and using the combination of the input bits in said examining phase, if the examination indicates that said bit does not correspond with any code word in said selected variable length code word table; and
repeating the above steps until a valid code word has been found from the selected variable length code word table.

26. A non-transitory storage medium having stored thereon a computer executable program code for use by an encoder, said program codes comprise instructions for:
selecting a variable length code word table from a set of variable length code word tables based on a value of a variable;
selecting a code word from the selected variable length code word table on the basis of said symbol;
updating the value of said variable by comparing the correspondence between said symbol and said variable wherein
if the comparison indicates that the value of the variable is smaller than the symbol, the value of said variable is incremented; else
if the comparison indicates that the value of the variable is greater than the symbol, the value of said variable is decremented; else
the value of the variable is not amended.

27. A non-transitory storage medium having stored thereon a computer executable program code for use by an encoder, said program codes comprise instructions for:
selecting a variable length code word table from a set of variable length code word tables based on a value of a variable;
using said code word to find a symbol corresponding said code word from the selected variable length code word table; and updating the value of said variable by comparing the correspondence between said symbol and said variable wherein
if the comparison indicates that the value of the variable is smaller than the symbol, the value of said variable is incremented; else
if the comparison indicates that the value of the variable is greater than the symbol, the value of said variable is decremented;
else the value of the variable is not amended.

* * * * *